(12) United States Patent
Shimada

(10) Patent No.: US 7,759,982 B2
(45) Date of Patent: Jul. 20, 2010

(54) CURRENT DETECTION CIRCUIT

(75) Inventor: Eiji Shimada, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 264 days.

(21) Appl. No.: 12/084,117

(22) PCT Filed: Oct. 24, 2006

(86) PCT No.: PCT/JP2006/321131

§ 371 (c)(1),
(2), (4) Date: Apr. 25, 2008

(87) PCT Pub. No.: WO2007/049597

PCT Pub. Date: May 3, 2007

(65) Prior Publication Data

US 2009/0261861 A1    Oct. 22, 2009

(30) Foreign Application Priority Data

Oct. 27, 2005    (JP)    ............................. 2005-312194

(51) Int. Cl.
*H03K 5/22*    (2006.01)
(52) U.S. Cl. ........................... 327/72; 327/73; 327/541; 327/543
(58) Field of Classification Search .................... 327/50, 327/63, 65, 67–70, 72–73, 538, 541, 543
See application file for complete search history.

(56) References Cited

U.S. PATENT DOCUMENTS

| 4,885,477 A | 12/1989 | Bird et al. |
| 5,815,027 A * | 9/1998 | Tihanyi et al. ............... 327/543 |
| 2008/0018387 A1* | 1/2008 | Ryu et al. .................... 327/541 |

FOREIGN PATENT DOCUMENTS

| JP | 8-86818 | 4/1996 |
| JP | 8-334534 | 12/1996 |
| JP | 2628694 | 4/1997 |
| JP | 11-68533 | 3/1999 |

* cited by examiner

*Primary Examiner*—Long Nguyen
(74) *Attorney, Agent, or Firm*—McGinn IP Law Group, PLLC

(57) ABSTRACT

There is provided a current detection circuit capable of preventing an excessive voltage from being applied to an input terminal of a differential amplifier, without resulting in reduction in current detection accuracy. The current detection circuit includes a power MOSFET 1 (a first semiconductor switching device), a sense MOSFET 2 (a second semiconductor switching device), a differential amplifier 3, a Zener diode 33 (a first voltage clamp device), a Zener diode 34 (a second voltage clamp device), an MOSFET 6 (a variable resistance device), a depletion type MOSFET 31 (a first MOSFET), and a depletion type MOSFET 32 (a second MOSFET).

20 Claims, 5 Drawing Sheets

CURRENT DETECTION CIRCUIT

TECHNICAL FIELD

The present invention relates to a current detection circuit.

BACKGROUND ART

In automobiles and home electric appliances, power ICs (Integrated Circuits) have been widely used so as to control voltage and current. Some power ICs use an MOSFET for power control (hereinafter referred to as a power MOSFET). On such a power IC, there are cases where a similar MOSFET (hereinafter referred to as a sense MOSFET) with a smaller area than the power MOSFET is mounted in order to detect (observe) current of the power MOSFET.

Generally, the power MOSFET has a configuration in which a plurality of small-sized MOSFETs (cells) are connected in parallel. The sense MOSFET also has a configuration in which a plurality of such cells are connected in parallel (refer to Patent Documents 1 to 3, for example). When drain-source voltages are set to be equal between the power MOSFET and the sense MOSFET, drain-source voltages between each cell that forms the power MOSFET and each cell that forms the sense MOSFET become equal. The same holds true for gate-source voltages. Accordingly, a mutually equal amount of current flows through each cell of the power MOSFET and each cell of the sense MOSFET. Thus, when a ratio of the number of the cells of the power MOSFET to the number of the cells of the sense MOSFET is n to one, a ratio of drain current of the power MOSFET to drain current of the sense MOSFET also becomes n to one.

As shown in FIG. 4, Patent Document 1 discloses a current detection circuit with a load 104 connected in series with a source terminal of a high side power MOSFET 101. Drain terminals of the power MOSFET 101 and a sense MOSFET 102 are both connected to a terminal 111. Gate terminals of the power MOSFET 101 and the sense MOSFET 102 are both connected to an input terminal 109 through a resistor 108. A control voltage is supplied to this input terminal 109. A source terminal of an MOSFET 106 is connected to a source terminal of the sense MOSFET 102.

A drain terminal of the MOSFET 106 is connected to a measuring resistor 105 through a terminal 110. A fixed potential is supplied to an other terminal of the measuring resistor 105. A gate terminal of the MOSFET 106 is connected to an output terminal of a differential amplifier 103. This differential amplifier 103 has two input ends. An inverted input end (−) of the differential amplifier 103 is connected to the source terminal of the sense MOSFET 102, while a non-inverted input end (+) of the differential amplifier 103 is connected to the source terminal of the power MOSFET 101. A voltage Vbb is applied to the terminal 111.

When a control voltage is supplied to the input terminal 109, the power MOSFET 101 and the sense MOSFET 102 are both brought into a conducting state. Then, load current flows through the load 104. Current flows through the sense MOSFET 102, MOSFET 106, and measuring resistor 105 as well. Now, assume that a source-drain voltage of the sense MOSFET 102 is larger than a source-to-drain voltage of the power MOSFET 101. In that case, a resistance of the MOSFET 106 increases due to an output voltage of the differential amplifier. Then, the current that passes through the sense MOSFET 102 is reduced, and a drain-source voltage of the sense MOSFET 102 is thereby reduced.

The current that passes through the sense MOSFET 102 is reduced until a difference between input voltages to the differential amplifier 103 becomes zero, or until a potential at the source terminal of the power MOSFET 101 equals a potential at the source terminal of the sense MOSFET 102. This means that in a stationary state, a current proportional to a current of the load 104 flows through the measuring resistor 105. That is, when an impedance of the load 104 is changed, control is performed so that a drain-source voltage of the power MOSFET 101 increases (or is reduced), the resistance of the MOSFET 106 is thereby reduced (or increases), and then the difference between the input voltages to the differential amplifier 103 always becomes zero.

[Patent Document 1] JP Patent Kokai Publication No. JP-A-8-334534
[Patent Document 2] JP Patent No. 2628694
[Patent Document 3] JP Patent Kokai Publication No. JP-A-11-68533

DISCLOSURE OF THE INVENTION

Problems to be Solved by the Invention

However, in the current detection circuit in FIG. 4, the source terminal of the power MOSFET 101 is connected to the input of the differential amplifier 103. Thus, when an excessive negative voltage is applied to the source terminal of the power MOSFET 101, the excessive negative voltage goes beyond an allowable input voltage range of the differential amplifier 103. Generally, when the differential amplifier is formed of MOSFETs, an input to the differential amplifier is supplied to a MOSFET gate. Thus, the differential amplifier is susceptible to go to electrostatic breakdown. For this reason, it is important to provide an excessive voltage protection circuit for a current detection circuit.

In view of this respect, Patent Document 1 discloses a current detection circuit provided with such a protection circuit, as shown in FIG. 5. In this current detection circuit, diodes 115, 116, 117, and 119, current sources 118 and 120, etc., are added to the current detection circuit in FIG. 4, in order to prevent an excessive voltage from being applied to each input terminal of the differential amplifier 103.

However, in this method, a difference between an anode-cathode voltage of the diode 117 and an anode-cathode voltage of the diode 119 is generated due to an individual difference between the diodes 117 and 119 and a difference between currents of the current sources 118 and 120. When the anode-cathode voltage of the diode 117 and the anode-cathode voltage of the diode 119 are defined as Vf17 and Vf19, respectively, and when the differential amplifier 103 has ideal characteristics (with an amplification factor thereof being ∞ and an input offset thereof being zero), a source voltage of the MOSFET 102 becomes higher than a source voltage of the MOSFET 101 by ΔVf=Vf17−Vf19. This generates the difference ΔVf between a drain-source voltage of each cell forming the MOSFET 101 and a drain-source voltage of each cell forming the MOSFET 102 (which holds true for gate-source voltages of the cells). For this reason, a sense ratio (which is a ratio of drain current of the MOSFET 101 to drain current of the MOSFET 102) does not match a cell ratio of n to 1. In other words, current detection accuracy is reduced.

Means to Solve the Problems

A current detection circuit according to the present invention includes:
(a) a first semiconductor switching device including a first terminal with a first fixed potential supplied thereto, a second terminal connected to an other end of a load, a second fixed potential being supplied to one end of the load, and a first current control terminal connected to a control input terminal;

(b) a second semiconductor switching device including a third terminal connected to the first terminal, a fourth terminal, and a second current control terminal connected to the first current control terminal;

(c) a differential amplifier including a non-inverted input terminal (+) and an inverted input terminal (−);

(d) a first voltage clamp device provided on a path between the first terminal and the non-inverted input terminal;

(e) a second voltage clamp device provided on a path between the first terminal and the inverted input terminal;

(f) a variable resistance device including a fifth terminal connected to the fourth terminal and a sixth terminal connected to an other terminal of a detecting resistor, the second fixed potential being supplied to one end of the detecting resistor, a resistor value of the variable resistance device being controlled by an output value of the differential amplifier;

(g) a first MOSFET provided on a path between the second terminal and the non-inverted input terminal; and (h) a second MOSFET provided on a path between the fourth terminal and the inverted input terminal.

In this current detection circuit, voltage clamp circuits are provided. An excessive voltage is thereby prevented from being applied to each input terminal of the differential amplifier. Further, when the differential amplifier has ideal characteristics, a sense ratio (of current of the first switching device to current of the second semiconductor switching device) matches a cell ratio (of the number of cells of the first switching device to the number of cells of the second switching device). Accordingly, a high current detection accuracy can be obtained.

Meritorious Effects of the Invention

According to the present invention, the current detection circuit is implemented which can prevent an excessive voltage from being applied to an input terminal of the differential amplifier without bringing about reduction in current detection accuracy.

Figure 1:
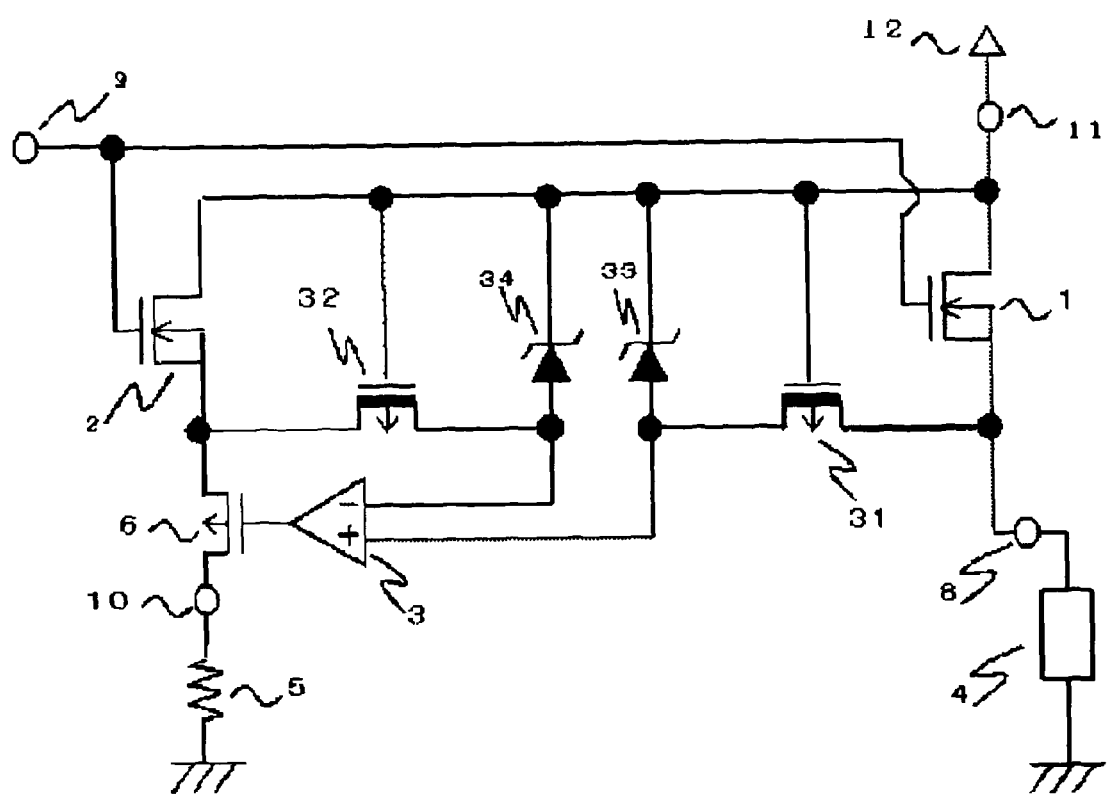
FIG. 1 is a circuit diagram showing a current detection circuit in a first exemplary embodiment of the present invention.

EXPLANATION OF REFERENCE NUMERALS 1 power MOSFET
2 sense MOSFET
3 differential amplifier
4 load
5 measuring resistor
6 MOSFET
8, 10, 11 terminal
9 input terminal
12 power supply
31, 32 depletion type MOSFET
33, 34 Zener diode
35 voltage source
37, 38 enhancement type MOSFET

PREFERRED MODES FOR CARRYING OUT THE INVENTION

Detailed description of exemplary embodiments of the present invention will be given below in detail with reference to drawings. In the description about the drawings, by assigning same reference numerals to same elements, a repeated description of the same elements will be omitted.

First Exemplary Embodiment

FIG. 1 is a circuit diagram showing a current detection circuit according to a first exemplary embodiment of the present invention. This current detection circuit includes a power MOSTET 1 (a first semiconductor switching device), a sense MOSFET 2 (a second semiconductor switching device), a differential amplifier 3, a Zener diode 33 (a first voltage clamp device), a Zener diode 34 (a second voltage clamp device), an MOSFET 6 (variable resistance device), a depletion type MOSFET 31 (a first MOSFET), and a depletion type MOSFET 32 (a second MOSFET).

The power MOSFET 1 includes a drain terminal (a first terminal) connected to a power supply 12, a source terminal (a second terminal) connected to a load 4, and a gate terminal (a first current control terminal). The sense MOSFET 2 includes a drain terminal (a third terminal) connected to the drain terminal of the power MOSFET 1, a source terminal (a fourth terminal), and a gate terminal (a second current control terminal) connected to the gate terminal of the power MOSFET 1. The differential amplifier 3 includes a non-inverted input terminal (+), an inverted input terminal (−), and an output terminal.

On a path between the drain terminal of the power MOSFET 1 and the non-inverted input terminal of the differential amplifier 3, the Zener diode 33 is provided. On a path between the drain terminal of the power MOSFET 1 and the inverted input terminal of the differential amplifier 3, the Zener diode 34 is provided. The MOSFET 6 includes a gate terminal connected to the output terminal of the differential amplifier 3, a source terminal (a fifth terminal) connected to the source terminal of the sense MOSFET 2, and a drain terminal (a sixth terminal) connected to a measuring resistor (detecting resistor) 5. On a path between the source terminal of the power MOSFET 1 and the non-inverted input terminal of the differential amplifier 3, the depletion type MOSFET 31 is provided. On a path between the source terminal of the sense MOSFET 2 and the inverted input terminal of the differential amplifier 3, the depletion type MOSFET 32 is provided.

The source terminal of the high side power MOSFET 1 is connected to one end of the depletion type MOSFET 31 and is also connected to the load 4 through a terminal 8. An other end of the load 4 is grounded. The respective drain terminals of the power MOSFET 1 and the sense MOSFET 2, respective gate terminals of the depletion type MOSFETs 31 and 32, and respective cathode terminals of the Zener diodes 33 and 34 are all connected to a terminal 11. The gate terminals of the power MOSFET 1 and the sense MOSFET 2 are both connected to an input terminal 9. A control voltage is supplied to this input terminal 9. To the source terminal of the sense MOSFET 2, the source terminal of the MOSFET 6 and one end of the depletion type MOSFET 32 are connected. To the drain terminal of the MOSFET 6, the measuring resistor 5 is connected through a terminal 10. A fixed potential is supplied to an other end of the measuring resistor 5. Preferably, the measuring resistor 5 is connected to a ground point.

The gate terminal of the MOSFET 6 is connected to the output terminal of the differential amplifier 3. This differential amplifier 3 has the two input terminals. The inverted input terminal of the differential amplifier 3 is connected to the other terminal of the depletion type MOSFET 32 and an anode of the Zener diode 34. The non-inverted input terminal of the differential amplifier 3 is connected to the other terminal of the depletion type MOSFET 31 and an anode of the Zener diode 33. The terminal 11 is connected to the power supply 12.

An operation and an effect of this current detection circuit will be described. A drain-source voltage of the power MOSFET 1 is defined as Vds1, a drain-source voltage of the sense MOSFET 2 is defined as Vds2, a potential difference between the terminal 11 and the non-inverted input terminal of the differential amplifier 3 is defined as V+, a potential difference between the terminal 11 and the inverted input terminal of the differential amplifier 3 is defined as V−, Zener voltage of the Zener diodes 33 and 34 is defined as Vz, and a forward voltage of the Zener diodes 33 and 34 is defined as Vf. By the Zener diodes 33 and 34, the potential differences V+ and V− are limited in a range from −Vf to +Vz. This prevents an excessive voltage from being applied to each input terminal of the differential amplifier 3. In other words, inputs to the differential amplifier 3 are protected. Further, a threshold value of the depletion type MOSFETs 31 and 32 is defined as Vtd (>0). The threshold value Vtd and the Zener voltage Vz are selected so that the threshold value Vtd is smaller than the Zener voltage Vz (Vtd<Vz). With this arrangement, currents that stationarily flow through the depletion type MOSFET 31 and 32, respectively, may be reduced to substantially zero. The reason for this will be described below.

An input impedance of the differential amplifier 3 is regarded as infinite. Since the Zener diode 33 and the depletion type MOSFET 31 are passive devices, Vds1≧V+≧0 holds in a stationary state. Assuming that the depletion type MOSFET 31 is in a conducting state (that is, V+<Vtd), V+<Vz holds. Thus, only reverse direction current (≈0) flows through the Zener diode 33. For this reason, only this reverse current flows through the depletion type MOSFET 31. When the depletion type MOSFET 31 is in a non-conducting state (that is V+≧Vtd), no current flows through the depletion type MOSFET 31. For the same reason, current that stationarily flows through the depletion type MOSFET 32 becomes substantially zero. Accordingly, a circuit formed of the Zener diodes 33 and 34 and the depletion type MOSFETs 31 and 32 consumes no stationary current. That is, in this exemplary embodiment, it is so arranged that by connecting the Zener diodes 33 and 34 in series with the depletion type MOSFETs 31 and 32, respectively, no stationary current flows through the Zener diodes 33 and 34. An increase in power consumption is thereby avoided.

When Vds1<Vtd, the depletion type MOSFET 31 is brought into the conducting state. Thus, Vds1=V+ holds. When the control voltage is supplied to the input terminal 9, the power MOSFET 1 and the sense MOSFET 2 are brought into the conducting state, and load current flows through the load 4. Current flows through the sense MSFET2, MOSFET 6, and measuring resistor 5 as well. When the depletion type MOSFET 32 is in the conducting state (Vds2<Vtd or V−<Vtd), Vds2=V− holds. A voltage difference between the potentials V+ and V− is amplified by the differential amplifier 3, and the gate of the MOSFET 6 is thereby controlled.

When Vds2>Vds1, resistance of the MOSFET 6 increases due to the output voltage of the differential amplifier 3. Then, the current that flows through the sense MOSFET 2 is reduced, and the drain-source voltage Vds2 is thereby reduced. The current that flows through the sense MOSFET 2 is reduced until V+=V−, or Vds1=Vds2. This means that the current proportional to the current of the load 4 flows through the measuring resistor 5 in the stationary state. That is, when an impedance of the load 4 is changed, control is performed so that the drain-source voltage Vds1 of the power MOSFET 1 increases (or decreases), and the resistance of the MOSFET 6 thereby decreases (or increases), and the voltage difference between input ends of the differential amplifier 3 always becomes zero. When the differential amplifier 3 has ideal characteristics (with an amplifier factor thereof being ∞ and an input offset thereof being zero), a sense ratio (of drain current of the MOSFET 1 to drain current of the MOSFET 2) matches a cell ratio (of the number of cells of the MOSFET 1 to the number of cells of the MOSFET 2). As described above, according to this exemplary embodiment, the current detection circuit is implemented which can prevent an excessive voltage from being applied to each input end of the differential amplifier without resulting in reduction in current detection accuracy.

In the above description, it is assumed that the depletion type MOSFET 32 is in the conducting state in an initial state. Even when the depletion type MOSFET 32 is in the non-conducting state (where Vds2≧Vtd and V−≧Vtd) in the initial state, the same result is obtained. As long as the depletion type MOSFET 32 is in the non-conducting state, V−≧Vtd>Vds=V+ holds. Thus, a resistor value of the MOSFET 6 keeps on increasing. The drain-source voltage Vds2 thereby soon becomes smaller than the threshold voltage Vtd. Thus, the depletion type MOSFET 32 is brought into the conducting state. Thereafter, the same result as in the case where the depletion type MOSFET 32 is assumed to be in the conducting state in the initial state is obtained. Incidentally, when Vds1≧Vtd, the operation of the current detection circuit in FIG. 1 differs from that described above. Accordingly, only when Vds1<Vtd, the sense ratio matches the cell ratio.

Second Exemplary Embodiment

Figure 2:
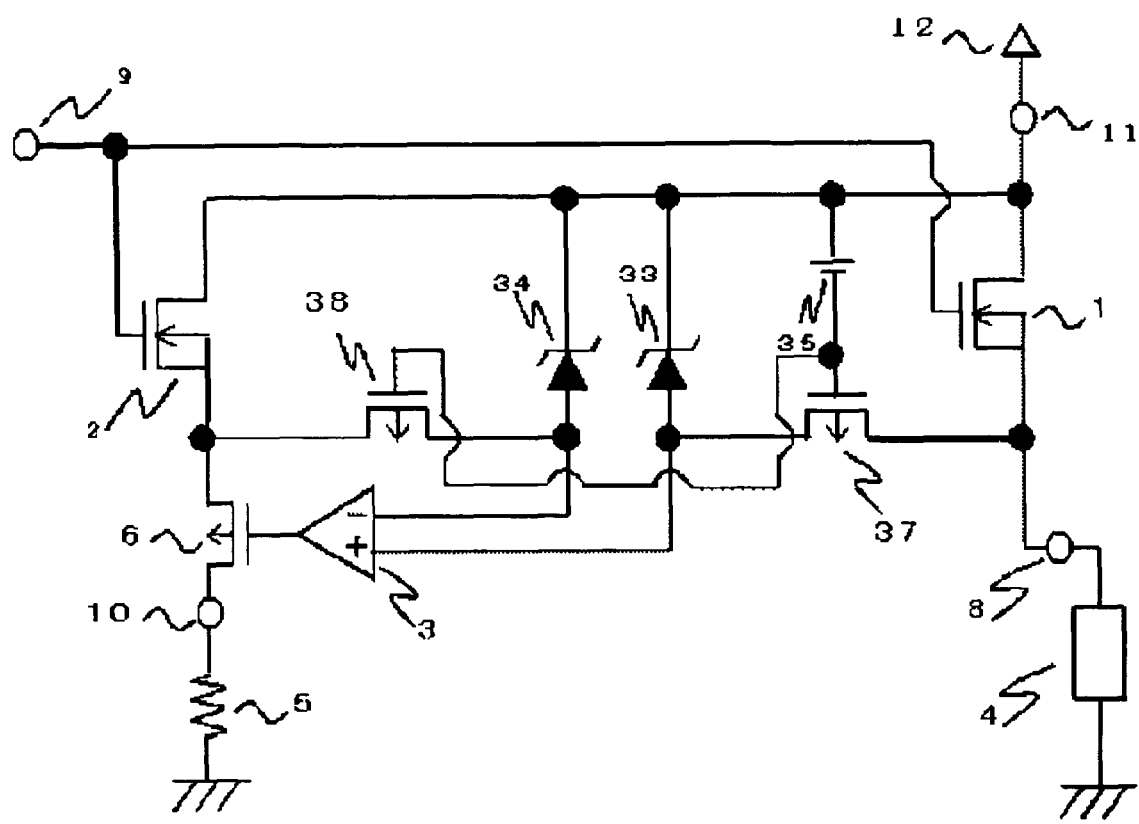
FIG. 2 is a circuit diagram showing a current detection circuit in a second exemplary embodiment of the present invention.

FIG. 2 is a circuit diagram showing a current detection circuit according to a second exemplary embodiment of the present invention. This current detection circuit includes the power MOSFET 1, sense MOSFET 2, differential amplifier 3, Zener diode 33, Zener diode 34, MOSFET 6, an enhancement type MOSFET 37 (a first MOSFET), and an enhancement type MOSFET 38 (a second MOSFET). That is, in this current detection circuit, the enhancement type MOSFETs 37 and 38 are employed in place of the depletion type MOSFETs 31 and 32 in FIG. 1, respectively. Further, respective gate terminals of the enhancement type MOSFETs 37 and 38 are connected to the terminal 11 through a voltage source 35.

A threshold value of the enhancement type MOSFETs 37 and 38 is defined as Vte (<0), and a voltage of the voltage source 35 is defined as Vp. Each of the enhancement type MOSFET 37 and 38 performs an operation similar to that of a depletion type MOSFET with a threshold value thereof being Vp+Vte. This corresponds to a case where the threshold value Vtd of each of the depletion type MOSFETs 31 and 32 is equal to (Vp+Vte) in FIG. 1. Accordingly, the current detection circuit in this exemplary embodiment also operates similarly to the current detection circuit in FIG. 1.

In addition to an effect the current detection circuit in FIG. 1 achieves, the current detection circuit in this exemplary embodiment achieves the following effect. That is, the voltage of the power source 35 can be set by the circuit, a value of (Vp+Vte) can be set without depending on a manufacturing process.

Figure 3:
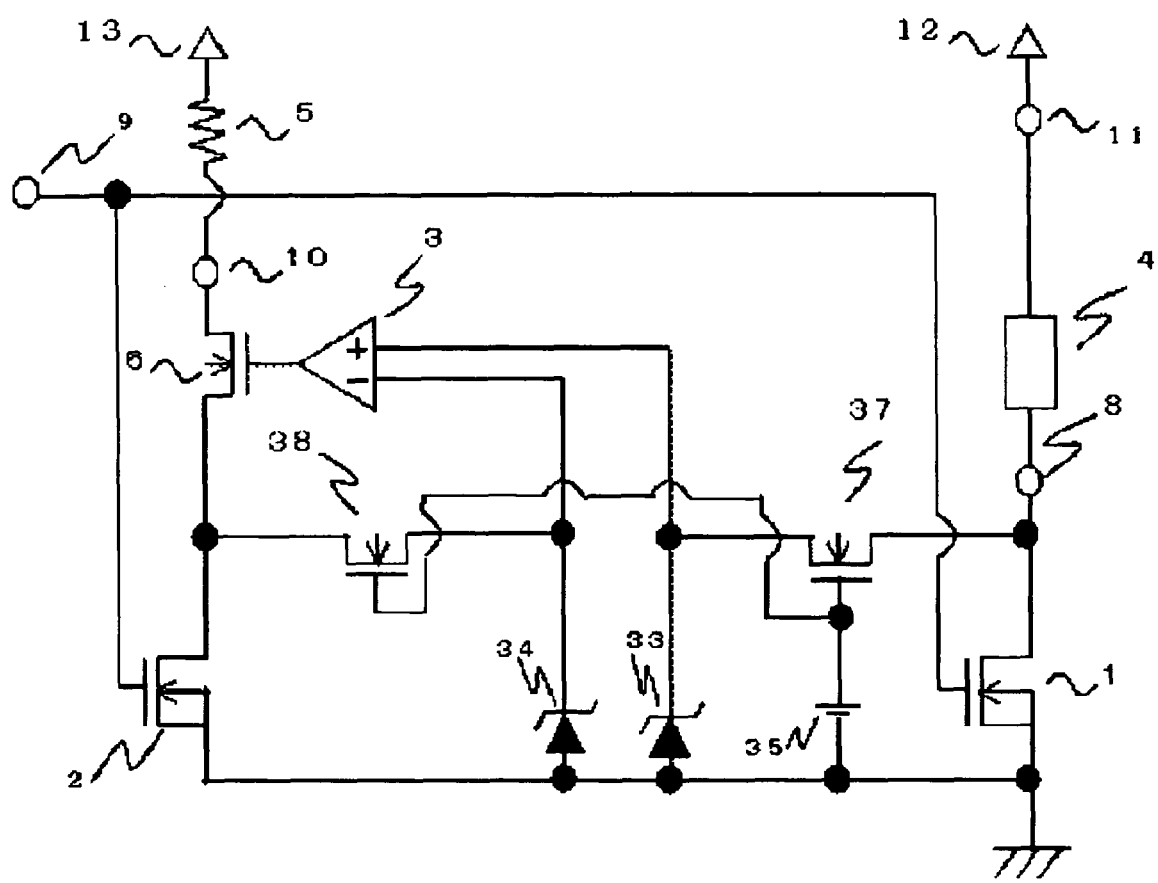
FIG. 3 is a circuit diagram showing a current detection circuit according to a variation example of the exemplary embodiment.
Figure 4:
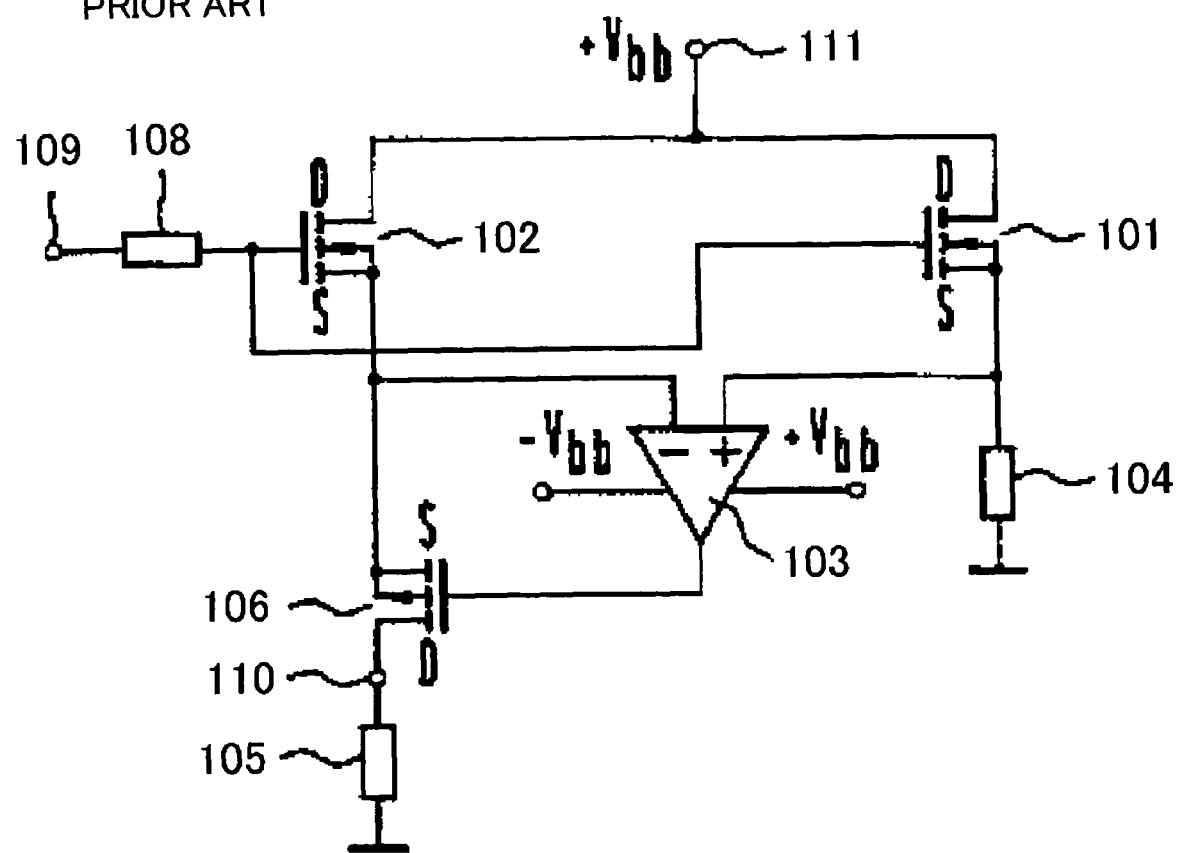
FIG. 4 is a circuit diagram showing a conventional current detection circuit.
Figure 5:
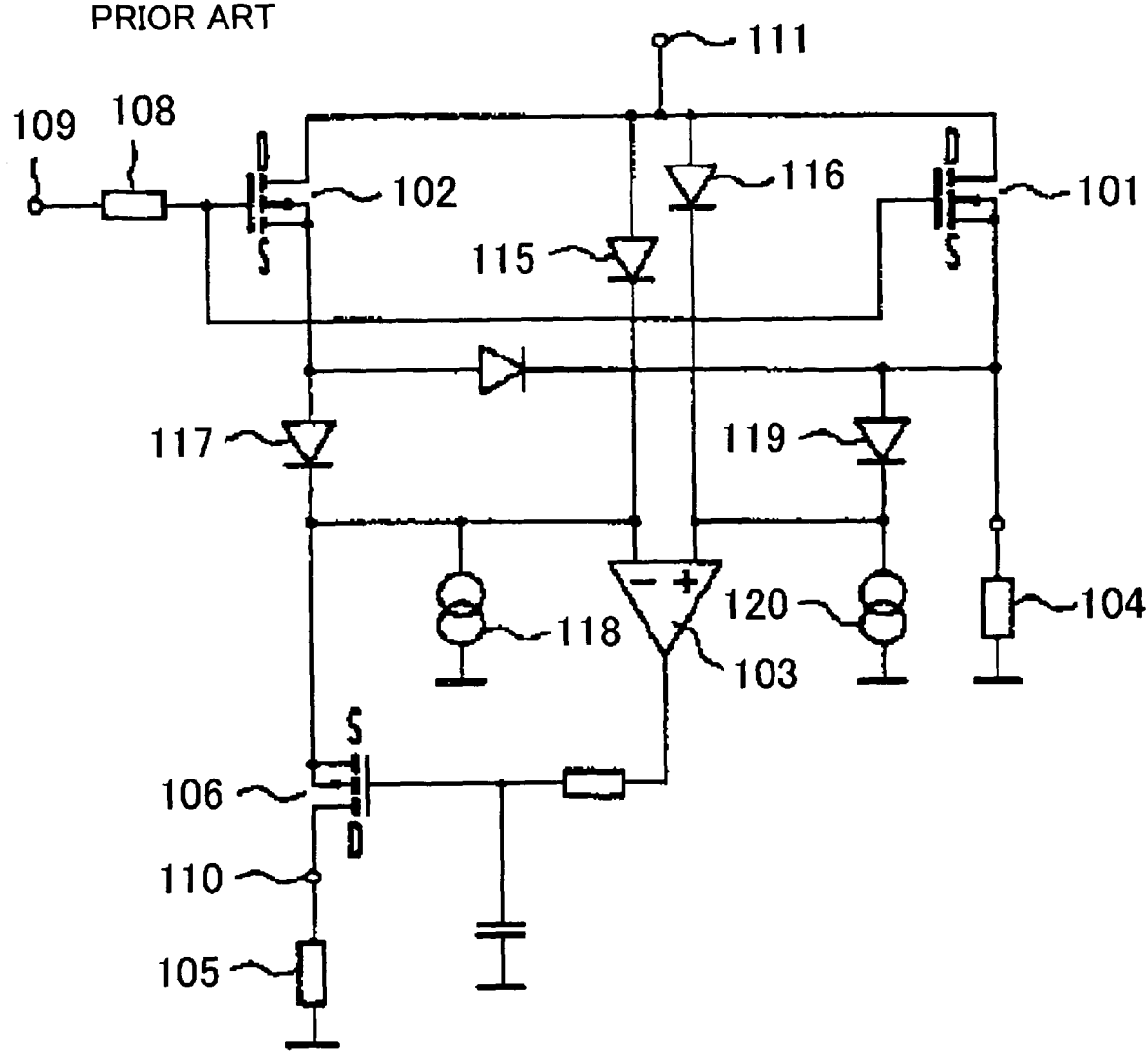
FIG. 5 is a circuit diagram showing a conventional current detection circuit.

The current detection circuit according to the present invention is not limited to those in the exemplary embodiments described above, and various variations of the current detection circuit are possible. In the exemplary embodiments described above, an example of a high side switch is shown. The present invention, however, may be applied to a low side switch as well. When the power MOSFET 1 is provided on a low side of the load 4 in the current detection circuit in FIG. 2, for example, a configuration as shown in FIG. 3 can be formed. In this example, the cathode terminal and an anode terminal of the Zener diode 33 are connected to the non-inverted input terminal of the differential amplifier 3 and the source terminal of the power MOSFET 1, respectively. Further, the cathode terminal and an anode terminal of the Zener diode 34 are connected to the inverted input terminal of the differential amplifier 3 and the source terminal of the power MOSFET 1, respectively. Even when the power MOSFET 1 is provided on the low side, an operation of the current detection circuit is the same as that when the power MOSFET 1 is provided on the high side.

The description was given, assuming that the sense MOSFET has the same cell structure as the power MOSFET. However, when characteristics of the power MOSFET and the sense MOSFET are similar, it is not essential that the power MOSFET and the sense MOSFET have the same cell structure. Though the example where the N-channel power MOSFET is used as a semiconductor switching device is shown, other power control device such as a P-channel power MOSFET, a bipolar transistor, an IGBT, or the like may be employed as the semiconductor switching device.

The voltage clamp devices are not limited to the Zener diodes illustrated in the exemplary embodiments described above. Other devices having a voltage clamp function may be employed. Further, according to a use of the current detection circuit, the measuring resistor 5 may be replaced by a load (such as a current mirror or a fixed current source) except for the resistor. Respective connecting destinations of the gate terminals of the depletion type MOSFETs 31 and 32, enhancement type MOSFTETs 37 and 38 are not limited to those illustrated in FIGS. 1 to 3.

INDUSTRIAL APPLICABILITY

The present invention can be applied to a power IC for automobiles, home electric appliances, or the like.

The invention claimed is:

1. A current detection circuit comprising:
a first semiconductor switching device including a first terminal with a first fixed potential supplied thereto, a second terminal connected to an other end of a load, a second fixed potential being supplied to one end of said load, and a first current control terminal connected to a control input terminal;
a second semiconductor switching device including a third terminal connected to said first terminal, a fourth terminal, and a second current control terminal connected to said first current control terminal;
a differential amplifier including a non-inverted input terminal (+) and an inverted input terminal (−);
a first voltage clamp device provided on a path between said first terminal and said non-inverted input terminal;
a second voltage clamp device provided on a path between said first terminal and said inverted input terminal;
a variable resistance device including a fifth terminal connected to said fourth terminal and a sixth terminal connected to an other terminal of a detecting resistor, the second fixed potential being supplied to one end of said detecting resistor, a resistor value of said variable resistance device being controlled by an output value of said differential amplifier;
a first MOSFET provided on a path between said second terminal and said non-inverted input terminal; and
a second MOSFET provided on a path between said fourth terminal and said inverted input terminal.

2. The current detection circuit according to claim 1, wherein said first and second voltage clamp devices comprise Zener diodes.

3. The current detection circuit according to claim 1, wherein
in a stationary state, said first and second MOSFETs are configured to be in a conducting state, and when a voltage equal to or larger than a predetermined voltage is applied to one of said first and second voltage clamp devices, a corresponding one of said first and second MOSFETs is configured to be brought into a non-conducting state.

4. The current detection circuit according to claim 1, wherein
said first and second MOSFETs comprise depletion type MOSFETs.

5. The current detection circuit according to claim 1, wherein
said first and second MOSFETs comprise enhancement type MOSFETs; and
a voltage source is connected to respective gate terminals of said first and second MOSFETs.

6. The current detection circuit according to claim 1, wherein
said variable resistance device comprises a third MOSFET with a gate terminal thereof connected to an output terminal of said differential amplifier.

7. The current detection circuit according to claim 1, wherein
the first and second fixed potentials comprise a power supply potential and a ground potential, respectively;
a cathode terminal and an anode terminal of said first voltage clamp device are connected to said first terminal and said non-inverted input terminal, respectively; and
a cathode terminal and an anode terminal of said second voltage clamp device are connected to said first terminal and said inverted input terminal, respectively.

8. The current detection circuit according to claim 1, wherein
the first and second fixed potentials comprise a ground potential and a power supply potential, respectively;
a cathode terminal and an anode terminal of said first voltage clamp device are connected to said non-inverted input terminal and said first terminal, respectively; and
a cathode terminal and an anode terminal of said second voltage clamp device are connected to said inverted input terminal and said first terminal, respectively.

9. The current detection circuit according to claim 2, wherein
in a stationary state, said first and second MOSFETs are configured to be in a conducting state, and when a voltage equal to or larger than a Zener voltage is applied to one of said Zener diodes, a corresponding one of said first and second MOSFETs is configured to be brought into a non-conducting state.

10. The current detection circuit according to claim 2, wherein
said first and second MOSFETs comprise depletion type MOSFETs.

11. The current detection circuit according to claim 3, wherein
said first and second MOSFETs comprise depletion type MOSFETs.

12. The current detection circuit according to claim 2, wherein
said first and second MOSFETs comprise enhancement type MOSFETs; and
a voltage source is connected to respective gate terminals of said first and second MOSFETs.

13. The current detection circuit according to claim 3, wherein
said first and second MOSFETs comprise enhancement type MOSFETs; and
a voltage source is connected to respective gate terminals of said first and second MOSFETs.

14. The current detection circuit according to claim 2, wherein
said variable resistance device comprises a third MOSFET with a gate terminal thereof connected to an output terminal of said differential amplifier.

15. The current detection circuit according to claim 3, wherein
said variable resistance device comprises a third MOSFET with a gate terminal thereof connected to an output terminal of said differential amplifier.

16. The current detection circuit according to claim 4, wherein
said variable resistance device comprises a third MOSFET with a gate terminal thereof connected to an output terminal of said differential amplifier.

17. The current detection circuit according to claim 5, wherein
said variable resistance device comprises a third MOSFET with a gate terminal thereof connected to an output terminal of said differential amplifier.

18. The current detection circuit according to claim 2, wherein
the first and second fixed potentials comprise a power supply potential and a ground potential, respectively;
a cathode terminal and an anode terminal of said first voltage clamp device are connected to said first terminal and said non-inverted input terminal, respectively; and
a cathode terminal and an anode terminal of said second voltage clamp device are connected to said first terminal and said inverted input terminal, respectively.

19. The current detection circuit according to claim 3, wherein
the first and second fixed potentials comprise a power supply potential and a ground potential, respectively;
a cathode terminal and an anode terminal of said first voltage clamp device are connected to said first terminal and said non-inverted input terminal, respectively; and
a cathode terminal and an anode terminal of said second voltage clamp device are connected to said first terminal and said inverted input terminal, respectively.

20. The current detection circuit according to claim 4, wherein
the first and second fixed potentials comprise a power supply potential and a ground potential, respectively;
a cathode terminal and an anode terminal of said first voltage clamp device are connected to said first terminal and said non-inverted input terminal, respectively; and
a cathode terminal and an anode terminal of said second voltage clamp device are connected to said first terminal and said inverted input terminal, respectively.

* * * * *